(12) United States Patent
Maydan et al.

(10) Patent No.: US 6,372,633 B1
(45) Date of Patent: Apr. 16, 2002

(54) METHOD AND APPARATUS FOR FORMING METAL INTERCONNECTS

(75) Inventors: Dan Maydan, Los Altos Hills; Ashok K. Sinha, Palo Alto; Zheng Xu; Liang-Yu Chen, both of Foster City; Roderick Craig Mosely, Pleasanton; Daniel Carl, Pleasanton; Diana Xiaobing Ma, Saratoga; Yan Ye, Campbell; Wen Chiang Tu, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/111,657

(22) Filed: Jul. 8, 1998

(51) Int. Cl.$^7$ .......................................... H01L 21/4763
(52) U.S. Cl. ...................................... 438/637; 257/763
(58) Field of Search .................. 438/622, 626, 438/629, 636, 637, 648; 257/763, 764

(56) References Cited

U.S. PATENT DOCUMENTS

| | | | | |
|---|---|---|---|---|
| 5,714,804 A | * | 2/1998 | Miller et al. | 257/63 |
| 5,793,112 A | * | 8/1998 | Hasegawa et al. | 257/758 |
| 5,981,378 A | * | 11/1999 | Bothra | 438/637 |
| 6,037,664 A | * | 3/2000 | Zhao et al. | 257/758 |

FOREIGN PATENT DOCUMENTS

| | | | | |
|---|---|---|---|---|
| EP | 0 448 276 A2 | 9/1991 | ........... | H01L/21/60 |
| EP | 0 455 341 A2 | 11/1991 | ........... | H01L/21/90 |
| EP | 0 720 228 A2 | 7/1996 | ......... | H01L/23/522 |
| JP | 07066202 | 3/1995 | ....... | H01L/21/3205 |

OTHER PUBLICATIONS

S. Wolf and R.N. Tauber, "Silicon Processing", Lattice Press, pp 546, table 2, 1986.*
PCT International Search Report dated Oct. 19, 1999.

* cited by examiner

Primary Examiner—David Nelms
Assistant Examiner—Quoc Hoang
(74) Attorney, Agent, or Firm—Moser, Patterson & Sheridan, LLP (57) ABSTRACT

The present invention provides a method and apparatus for forming reliable interconnects in which the overlap of the line over the plug or via is minimized or eliminated. In one aspect, a barrier plug comprised of a conductive material, such as tungsten, is deposited over the via to provide an etch stop during line etching and to prevent diffusion of the metal, such as copper, into the surrounding dielectric material if the line is misaligned over the via. Additionally, the barrier plug prevents an overall reduction in resistance of the interconnect and enables reactive ion etching to be employed to form the metal line. In another aspect, reactive ion etching techniques are employed to selectively etch the metal line and the barrier layer to provide a controlled etching process which exhibits selectivity for the metal line, then the barrier and then the via or plug.

10 Claims, 10 Drawing Sheets

METHOD AND APPARATUS FOR FORMING METAL INTERCONNECTS

BACKGROUND OF THE INVENTION

1. Field of the Invention

The invention relates to a method and apparatus for forming interconnects and other conductive features in the fabrication of integrated circuits and other electronic devices. More particularly, the invention relates to a method and apparatus for forming zero overlap interconnects.

2. Background of the Related Art

Consistent and fairly predictable improvement in integrated circuit design and fabrication has been observed in the last decade. One key to successful improvements is the multilevel interconnect technology which provides the conductive paths between the devices of an integrated circuit (IC) device. The shrinking dimensions of horizontal lines and vertical contacts or vias in very large scale integration (VLSI) and ultra large scale integration (ULSI) technology has increased the importance of forming zero overlap interconnects. Zero overlap refers to the alignment of a line over a plug or a via. In the past, the line width has been greater than the diameter of the contact or via to prevent misalignment between the vias and lines due to distortions in the patterning and etching of the lines. However, with increased circuit density and smaller feature sizes, the need to reduce or eliminate the overlap has become necessary.

Figure 1:
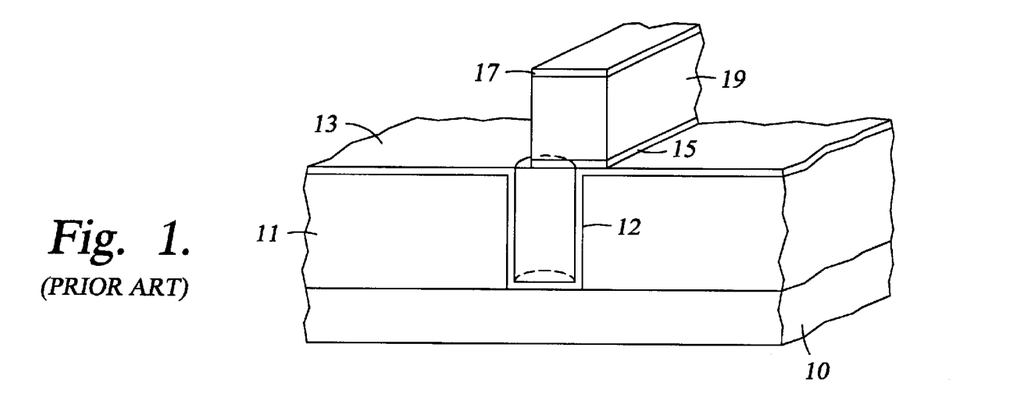
FIG. 1 is a cross sectional view of a standard interconnect.

FIG. 1 shows a standard aluminum interconnect formed on a substrate over an aluminum metal layer 10. In the process sequence used to from this interconnect, a hole is etched through a dielectric and then filled with a metal to create a conductive path through the dielectric. Metal lines are then formed between filled holes by first depositing a blanket of metal over the dielectric and filled holes and then selectively etching the metal blanket to leave metal lines between the filled holes. The process sequence is performed on a substrate having a metal aluminum layer 10 formed on the substrate and having a low dielectric constant insulator 11, such as silicon oxide, formed thereover. A via 12 is patterned and etched into the dielectric layer to expose the conductive metal layer 10. A liner 13 is deposited conformally in the via and on the field of the low k dielectric layer to provide an adhesive layer as well as a nucleation layer on which tungsten can be deposited using chemical vapor deposition (CVD) to fill the via. Tungsten is deposited as a blanket layer using chemical vapor deposition (CVD) to fill the via and form a blanket layer on the field of the substrate. A chemical mechanical polishing (CMP) process or a tungsten etch back process is then performed to remove the tungsten from the field of the substrate, leaving the via filled with tungsten. An aluminum stack is then formed over the substrate field by first depositing a titanium/titanium nitride liner layer 15 and then depositing a copper doped aluminum layer thereover. The aluminum stack is preferably deposited using physical vapor deposition (PVD) techniques. Next, an antireflective coating (ARC), such as a titanium/titanium nitride layer 17 is deposited over the aluminum stack using PVD. The ARC and aluminum stack are then patterned and etched to leave lines 19 over and between the vias 12 formed below. Typically, reactive ion etching (RIE) is used to etch the aluminum stack and ARC to form the line, which is selective for the aluminum, titanium and titanium nitride. RIE has been shown to perform well with aluminum to define good lines with straight sidewalls. The RIE process used demonstrates a high selectivity for these materials as opposed to tungsten, thereby enabling the tungsten to act as an etch stop for the RIE process.

However, the RIE step used to form the metal line typically has a ten (10) percent non-uniformity factor which requires that the metal stack be over-etched by at least ten (10) percent to insure that all of the metal is removed from the field of the substrate over the dielectric material. Consequently, if the same metal is used for both the via and the line as would be beneficial, a portion of the via may also be etched if misalignment between the line and the via is present, thereby negatively affecting the reliability of the interconnect.

To overcome the limits imposed by the etching requirements and the 10% non-uniformity, the line is typically left wider than the diameter of the via as the RIE process exhibits good selectivity between the line stack and the tungsten which fills the via. This insures that the via will not be etched during the formation of the line because the etch process used to form the line can be selective for aluminum and stop when it reaches the dielectric and/or the tungsten extending therethrough. Because the line in this case is wider than the diameter of the via, any offset due to the patterning process would still result in the line being located over the via. Additionally, the etch process can have a higher selectivity for aluminum compared to tungsten. In such case, if the line were severely offset, the etch process would not intrude into the tungsten via.

With the trend to achieve faster speeds in devices and the demand for increased circuit density, it has become necessary to reduce, and even eliminate, the overlap between the lines and the vias and change the material from tungsten to aluminum and/or copper. Consequently, it has become necessary to provide a process for forming interconnects which can accommodate the use of the same material for both the via and the line and also to accommodate the reduction in overlap between the line and the via.

Therefore, there is a need for a method and apparatus for reliably forming a metal interconnect which can accommodate misalignment between the via and the line.

SUMMARY OF THE INVENTION

The present invention generally provides a method and apparatus for forming an interconnect with zero overlap between the line and the via. The invention uses the selectivity of metal etch processes to prevent over-etching into the via during line formation.

In one embodiment, an etch barrier is formed over the filled via to act as an etch barrier when the metal line is etched. In this embodiment, a dielectric layer is patterned and etched to form a via therethrough. Next, a barrier layer is deposited conformally within the via to prevent metal (e.g., aluminum and copper, primarily a concern with copper) diffusion into the surrounding dielectric material. Next, the metal is deposited into the via over the barrier layer and onto the field of the substrate. Preferably, the metal is deposited using a low temperature process such as a combination of CVD followed by PVD or electroplating. Next, the metal is chemically mechanically polished or etched back to remove the metal from the field of the substrate, leaving a metal filled via. Next, an etch barrier layer is deposited over the via to prevent metal diffusion into subsequently deposited dielectric material and to serve as an etch stop during line formation. The etch barrier is preferably formed of a conductive material such as tungsten. Next, a metal stack is deposited over the via and the field of the substrate by first depositing a barrier layer and then a metal layer thereover. Next, an antireflective coating is formed over the upper surface of the metal layer and a line is patterned and etched into the metal stack. An etch process and chemistry having a greater selectivity for the metal in the via as compared to the etch barrier material, e.g., copper to tungsten, is used to etch the line and stop on the barrier.

In another embodiment, the metal deposited on the field of the substrate during via fill is chemically mechanically polished or etched back sufficiently to remove a portion of the metal in the via and form a recess in the upper portion of the via below the upper surface of the dielectric material in which the via is formed. A barrier material is then deposited on the substrate to fill the recess formed over the via and form an etch barrier over the top of the via. The etch barrier is then chemically mechanically polished or etched back to planarize the upper surface of the via with the substrate. Next, the metal stack is formed over the metal via and etch barrier and the line etched therethrough.

In another embodiment, the via is filled with a metal and planarized using CMP or an etchback process. A barrier layer is then formed over the filled via and the field of the substrate. The metal stack is then formed over the barrier layer and the line etched therethrough. An etch sequence is used which is selective first for the ARC layer, then the metal layer and then the barrier layer. By controlling the etch sequence and selectivity of each process, a zero-overlap interconnect can be formed by etching each layer using a different chemistry until the line has been formed over the via.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides a method and apparatus for forming an interconnect using reactive ion etching to form a metal line. In one aspect of the invention, an etch barrier is formed over a via prior to deposition and etching to create a line thereover. In this aspect, a conductive etch barrier is used in combination with a selective etch chemistry to form the line without over-etching into the via if slight mis-alignment is present. The etch barrier is formed over the filled via to provide an etch stop for the etch process used to form the line.

In another aspect of the invention, an etch sequence is used to form a line which is selective for the various materials used to form the barrier layer and the metal stack over the via. At least two etch chemistries are employed either in the same chamber or in separate chambers to etch through the metal and then through the barrier layer formed over the via and the field of the substrate.

A passivation layer, such as a silicon nitride (SiN) layer or other passivation layer, is preferably deposited over the resulting structure according to known techniques in the art.

Self Aligned Barrier on Copper

Figure 2:
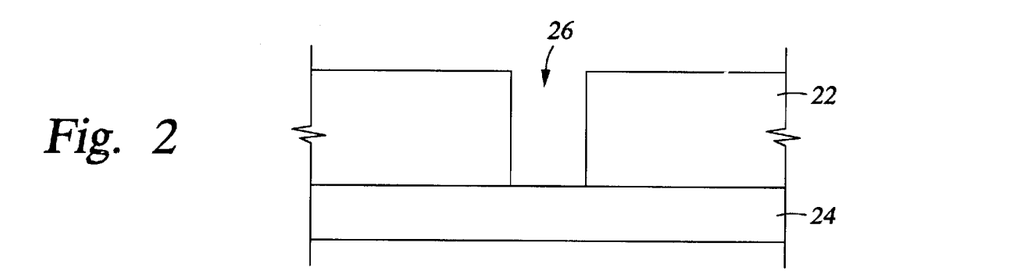
FIGS. 2–12 are cross sectional views showing one sequence of the invention showing a zero overlap process formed over a conductive metal layer.
Figure 3:
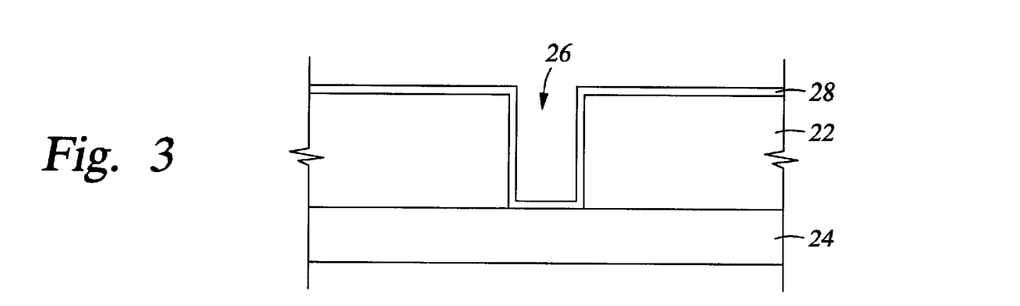

FIGS. 2 through 12 are cross sectional views of a substrate depicting a process sequence for forming an interconnect according to one embodiment of the invention. FIG. 2 shows a dielectric layer 22 formed over a conductive or metal layer 24. A via 26 is formed through the dielectric layer 22 and extends down to the metal layer 24. Preferably, the metal layer 24 is made of copper. However, other conductive materials such as aluminum, tungsten and the like can be used. The dielectric layer 22 is preferably made of a low dielectric constant material such as silicon oxide, fluorine doped silicon oxide or carbon fluoride. A conformal barrier layer 28 is then deposited over the surface of the dielectric layer 22 and in the via 26 as shown in FIG. 3. The barrier layer 28 is preferably made of a material such as tantalum, tantalum nitride, titanium, titanium nitride or other barrier materials known in the art. The barrier layer 28 is preferably deposited using high density plasma physical vapor deposition, such as an Ionized Metal Plasma (IMP) process provided by Applied Materials, Inc. of Santa Clara, Calif., to enable good conformal coverage in high aspect ratio features (i.e., height to width ratios). However, other techniques such as physical vapor deposition, chemical vapor deposition, electrodeless plating, electroplating and the like can be used. The barrier layer 28 prevents diffusion of the metal into the surrounding dielectric material and also provides a good adhesive layer on the surrounding dielectric onto which the metal can be deposited.

Figure 4:
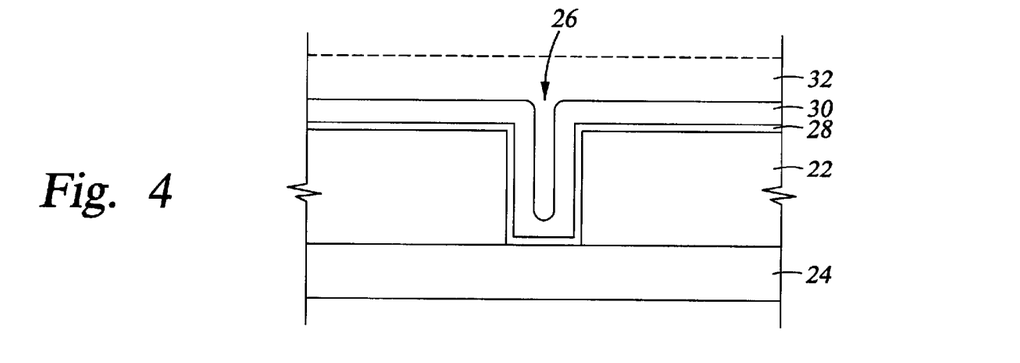
Figure 5:
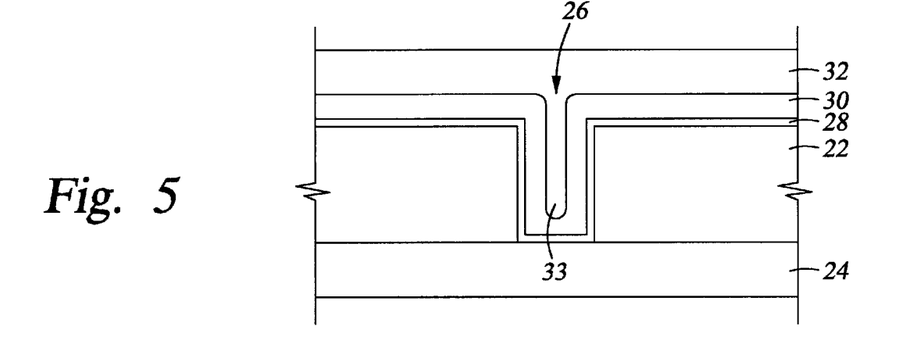

The via 26 is then filled with a metal, such as copper, as illustrated in FIGS. 4 and 5. A low temperature process is preferably used which first deposits the metal using chemical vapor deposition techniques to form a conformal wetting layer 30 over the surface of the barrier layer 28. Subsequently, metal layer 32 is deposited over the conformal wetting metal layer 30 using physical vapor deposition (PVD) to completely fill the via 26. In addition, electroplating can be used to fill the via, alone or in combination with a CVD or PVD seed layer, or a combination of a CVD/PVD seed layer. While these methods are preferred, other techniques known in the art could be employed as well. Filling of the via will also result in deposition of the via fill material over the field of the substrate, i.e., on the surface of the dielectric layer between the vias, contacts, etc.

Figures 6, 7:
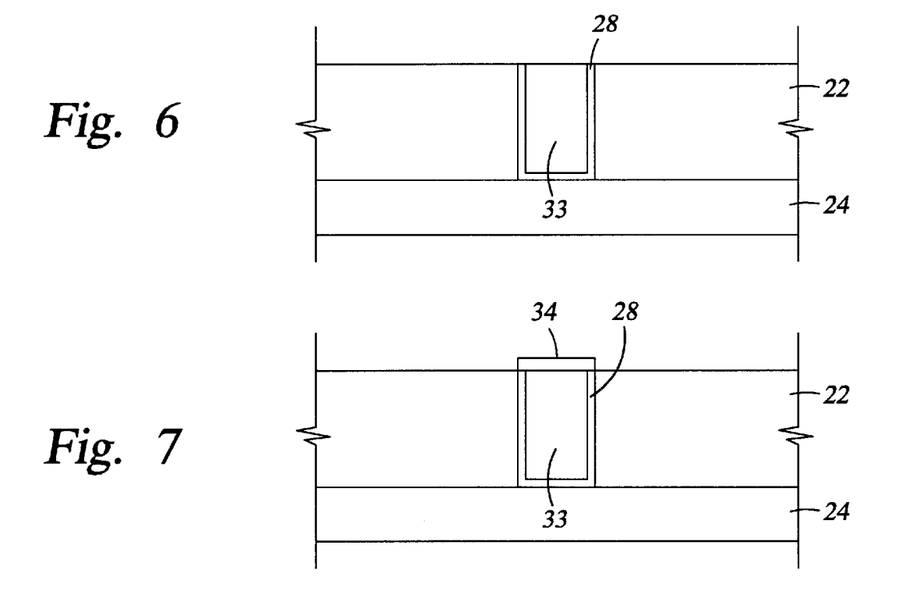

The portion of the metal which is formed over the field of the substrate, i.e., the upper surface of the dielectric layer 22 between the vias, is then removed using either chemical mechanical polishing or an etch back process as shown in FIG. 6. Following the removal of the metal from the field, a metal filled via 33 remains with a barrier layer 28 disposed between the metal filling the via and the dielectric 22. Next, a second barrier layer 34 is selectively deposited over the metal filled via 33 and the upper surface of the barrier layer 28 to prevent diffusion of copper into the dielectric. The barrier layer 34 is preferably made of a conductive material, such as tungsten, or other material which is conductive and for which an etch process can exhibit good selectivity in relation to the metal used to fill the via and the line.

Figure 8:
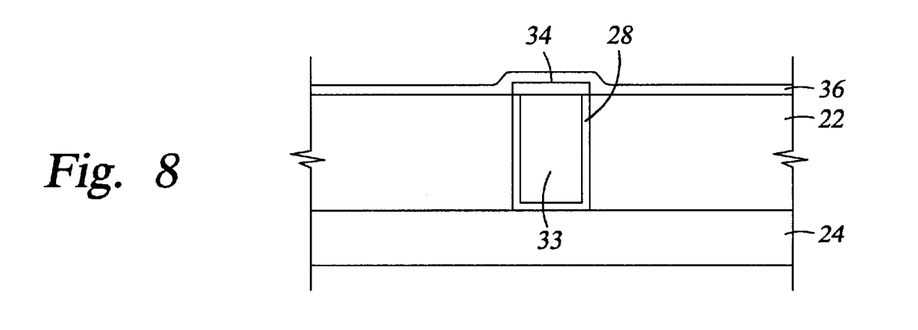
Figure 9:
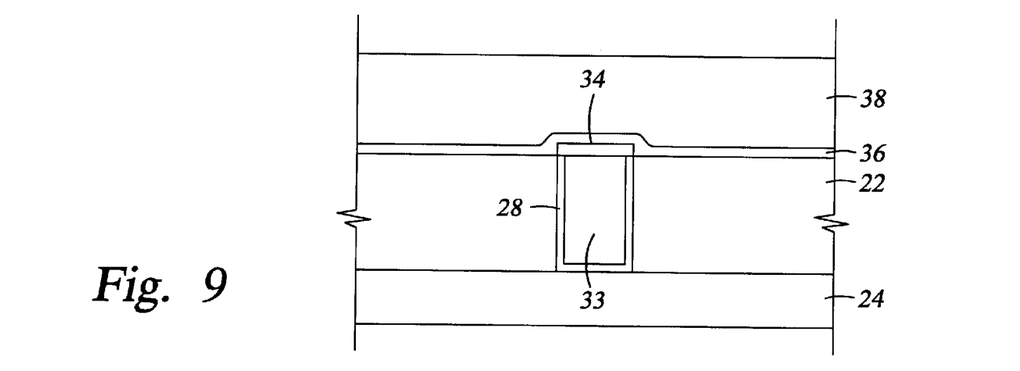
Figure 10:
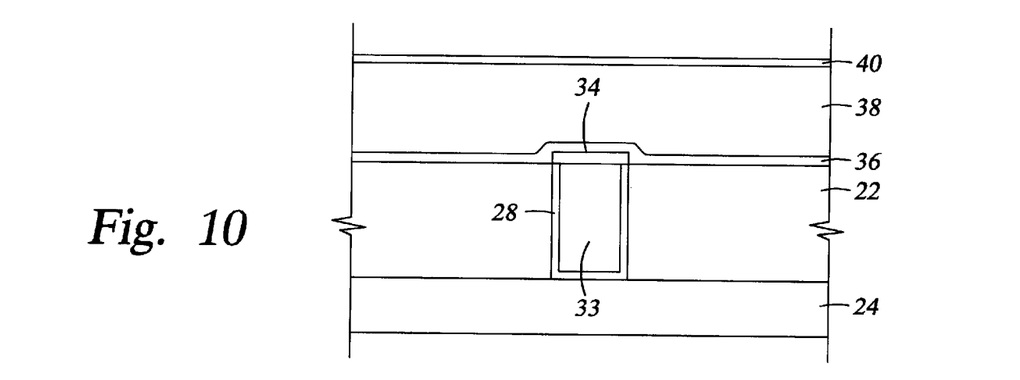
Figure 11:
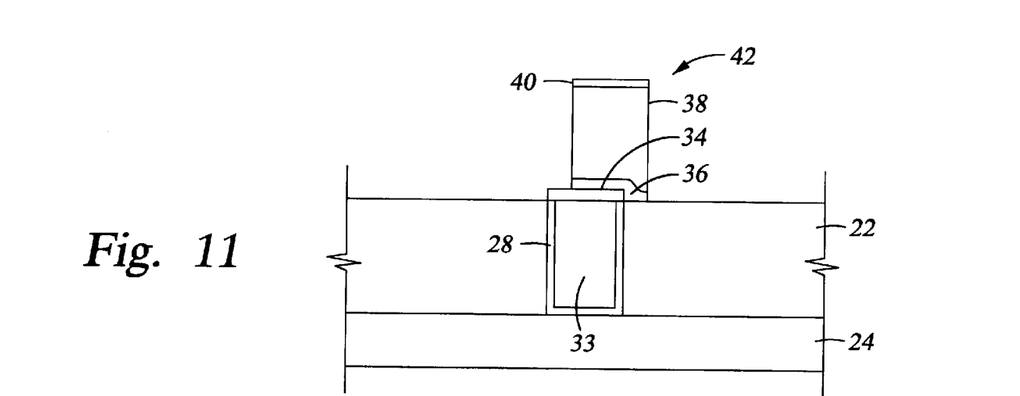
Figure 12:
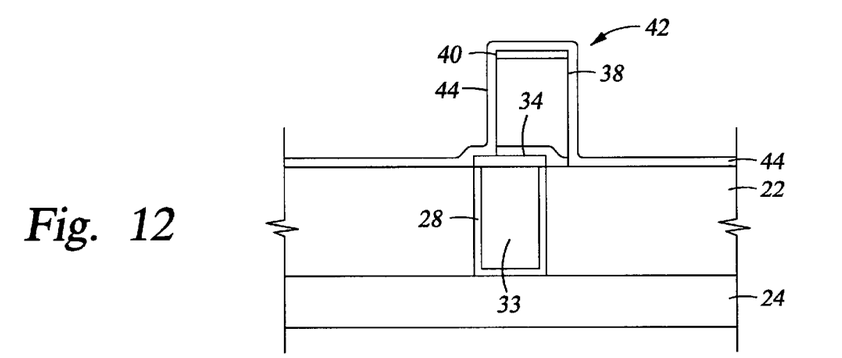
Figure 13:
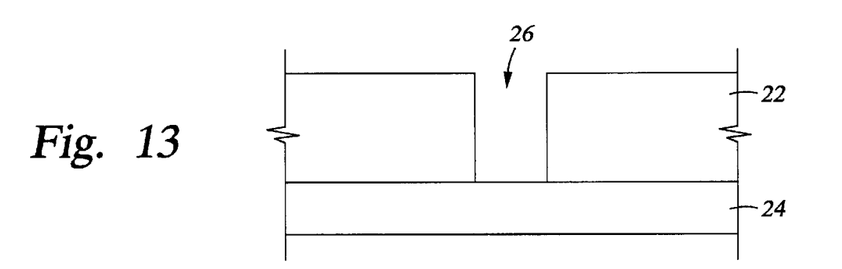
FIGS. 13–24 are cross sectional views showing one sequence of the invention showing a zero overlap process formed over a conductive metal layer.
Figure 14:
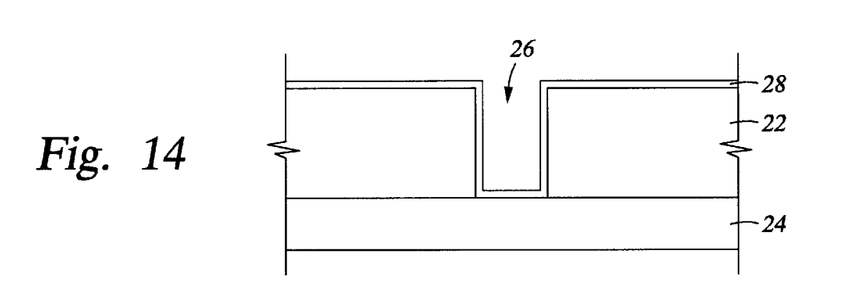
Figure 15:
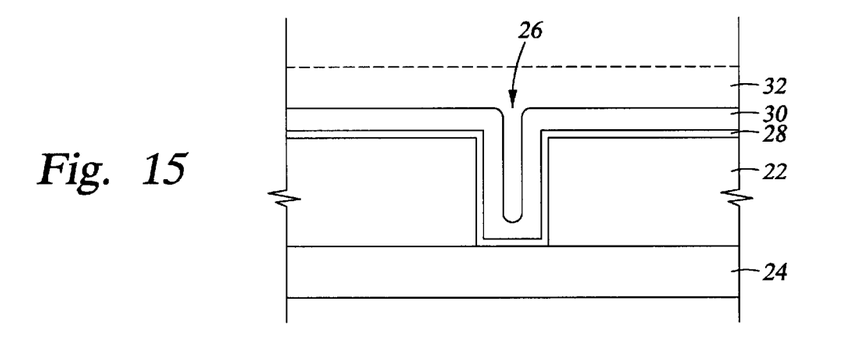
Figure 16:
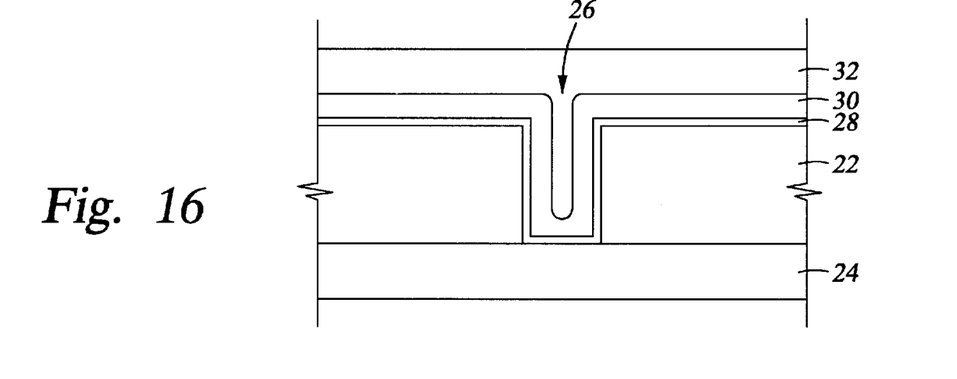

A blanket metal layer 38 is then deposited over the barrier layer 34 by first depositing a subsequent barrier layer 36 such as tantalum, tantalum nitride, titanium, titanium nitride, or combinations thereof and then depositing a metal layer 38, such as copper, thereover as shown in FIGS. 8 and 9. Subsequently, an anti-reflective coating (ARC) 40, such as tantalum, tantalum nitride, tungsten nitride, titanium, titanium nitride or the like, can be deposited over the metal layer 38 as shown in FIG. 10. A metal line 42 is then patterned over the ARC and formed using reactive ion etching techniques to connect the vias formed below as shown in FIG. 11. A passivation layer 44, such as a silicon nitride layer, is then deposited conformally over the feature as shown in FIG. 12.

Blanket Tungsten with CMP or Etchback Barrier on Copper

Figure 17:
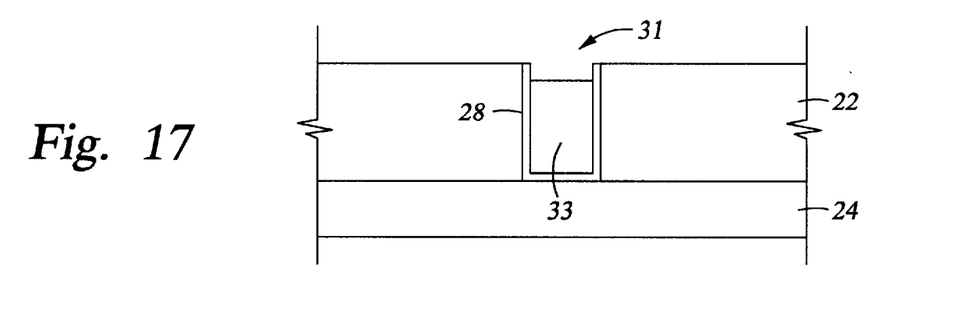
Figure 18:
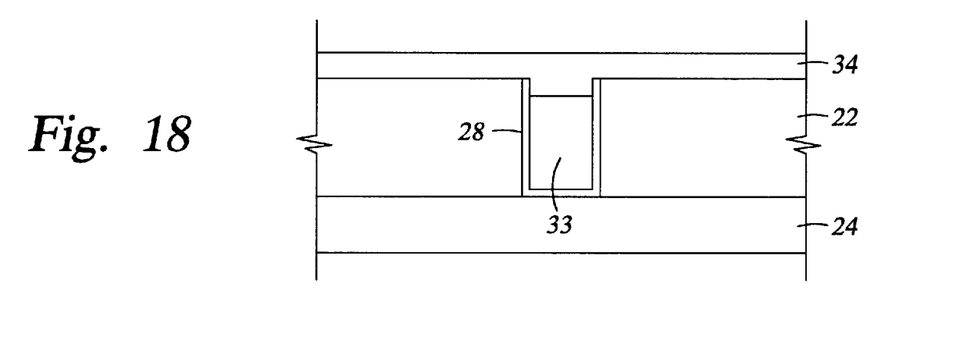
Figure 19:
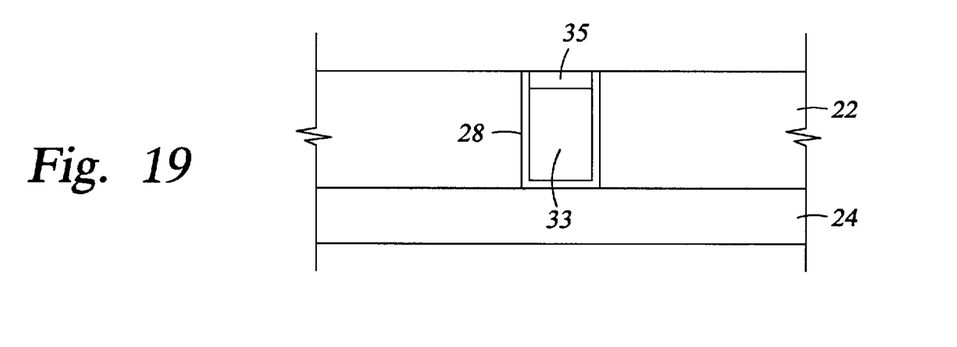
Figure 20:
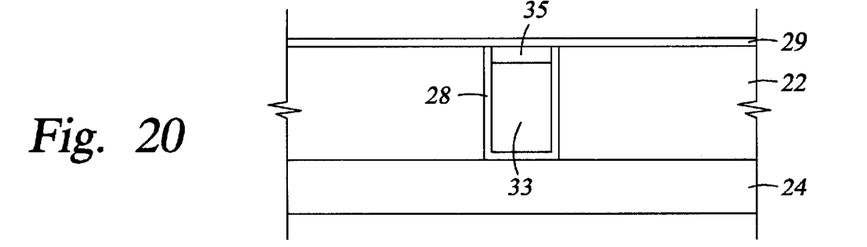
Figure 21:
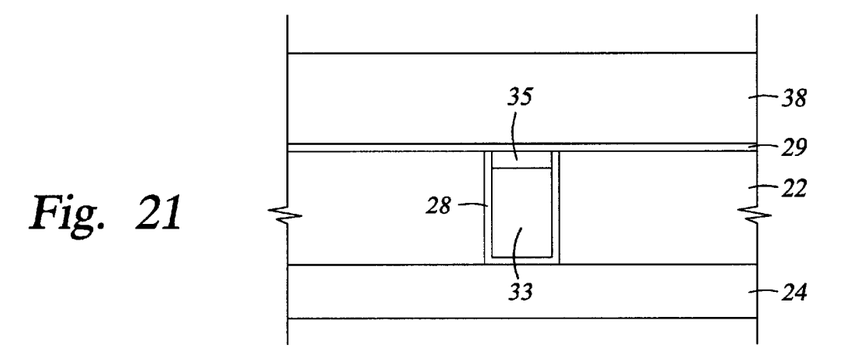
Figure 22:
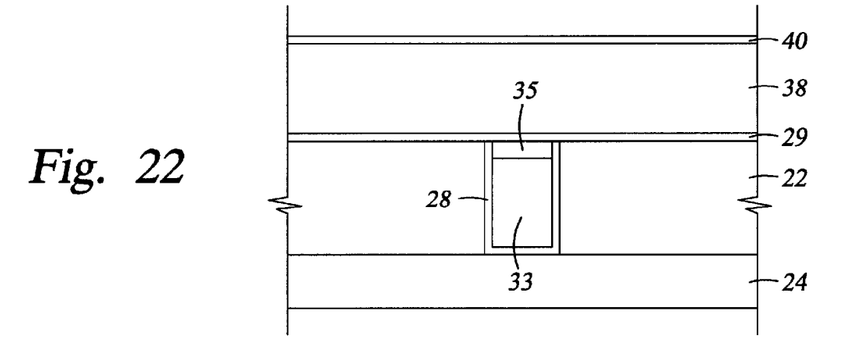
Figure 23:
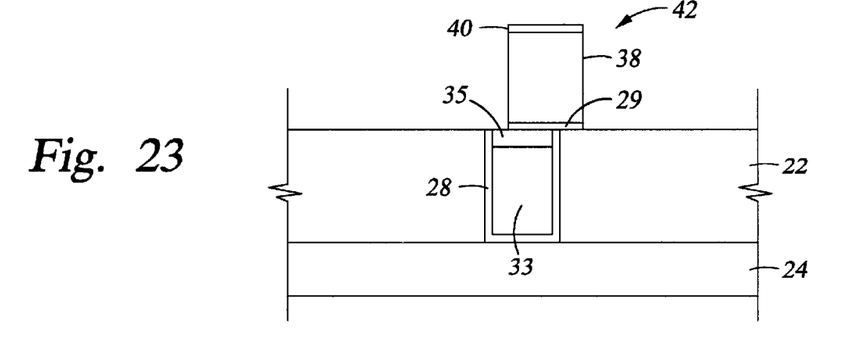
Figure 24:
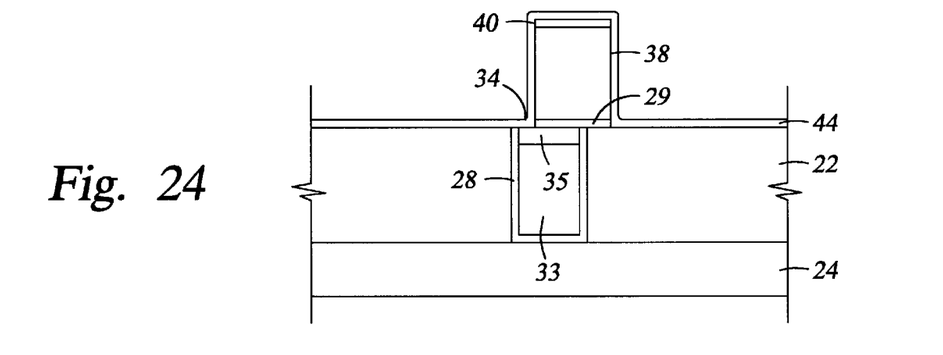
Figure 25:
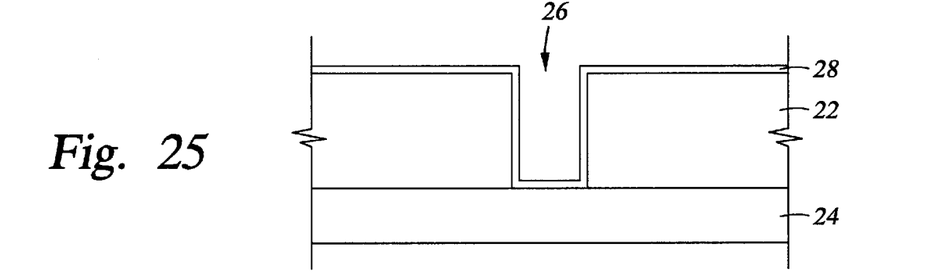
FIGS. 25–34 are cross sectional views showing one sequence of the invention showing a zero overlap process formed over a conductive metal layer.
Figure 26:
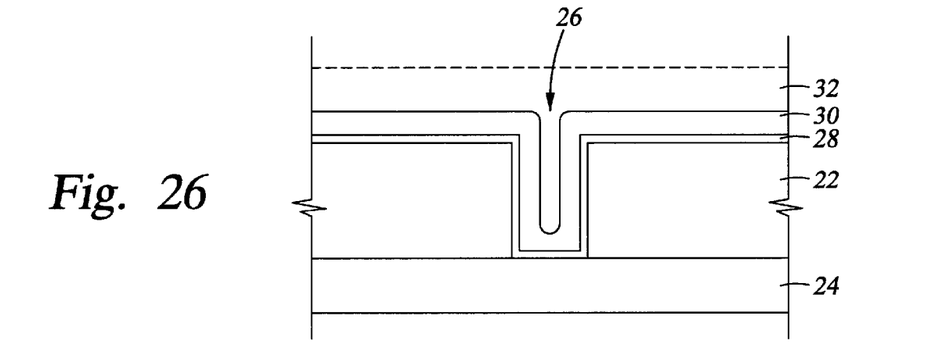
Figure 27:
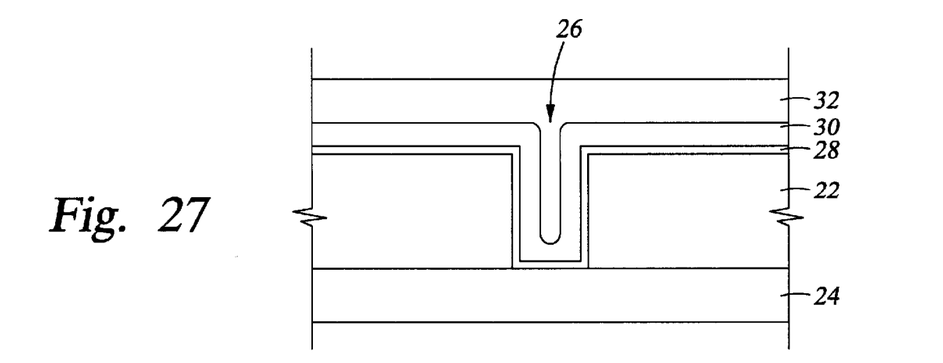
Figure 28:
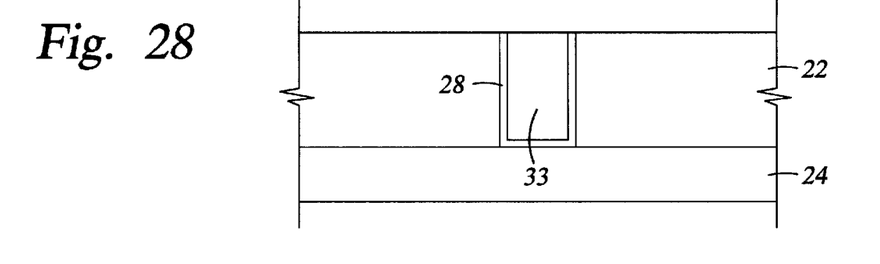

FIGS. 13 through 24 are cross sectional views of a substrate depicting another embodiment of a process sequence for forming an interconnect according to the invention. In this embodiment, similar layers will be similarly numbered for ease of description. FIGS. 13 through 16 depict similar steps disclosed in FIGS. 2 through 5 above including forming a via in a dielectric layer 22, forming a conformal barrier layer 28 in the via, filling the via 26 by depositing a metal in the via. As stated above, the two-step low temperature process is a preferred technique, however, other known deposition techniques, including electroplating, CVD, and PVD, can be used The metal layer 30, 32 formed over the substrate and the barrier layer 28 on the field of the substrate is then etched back using reactive ion etching or is chemically mechanically polished back to the dielectric layer 22. In the case of reactive ion etching, the etching process is continued once the endpoint is detected, ie., after all material is etched from the field, to over-etch the via 26 and form a recess 31 in the upper surface of the via as shown in FIG. 17. If CMP is used, the process conditions are adjusted so that over polishing occurs in the via to form a recess in the upper portion thereof. A second barrier layer 34, preferably comprised of tungsten, is then deposited as a blanket layer in the recess 31 and on the field of the substrate to fill the recess as shown in FIG. 18. Next, the second barrier layer 34 is chemically mechanically polished to planarize the surface and leave a barrier plug 35 in the depression formed in the upper surface of the via as shown in FIG. 19, while removing the barrier material from the field. Subsequently, a barrier layer 28 is formed over the plug 35 and the field of the substrate as shown in FIG. 20. Then, a metal layer 38 is formed over the barrier layer 28 and the barrier plug 35 as shown in FIG. 21 and described in reference to FIG. 9. An anti-reflective coating 40 is then deposited over the metal layer 38 (as shown in FIG. 22) and the combination is etched using reactive ion etching to form the line 42 (as shown n FIG. 23). A passivation layer 44, such as a silicon nitride layer is then preferably deposited over the line as shown in FIG. 24.

Stack Etch Stop on Tantalum and on Copper

Figure 29:
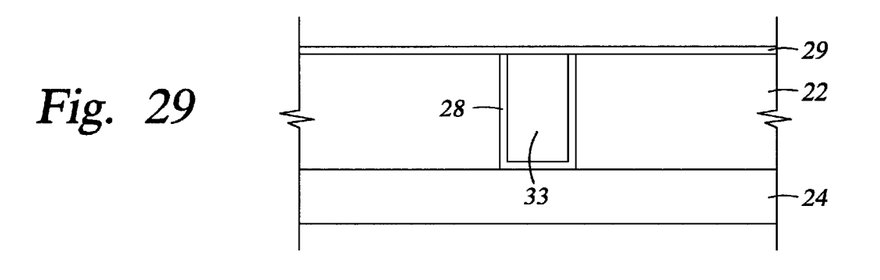
Figure 31:
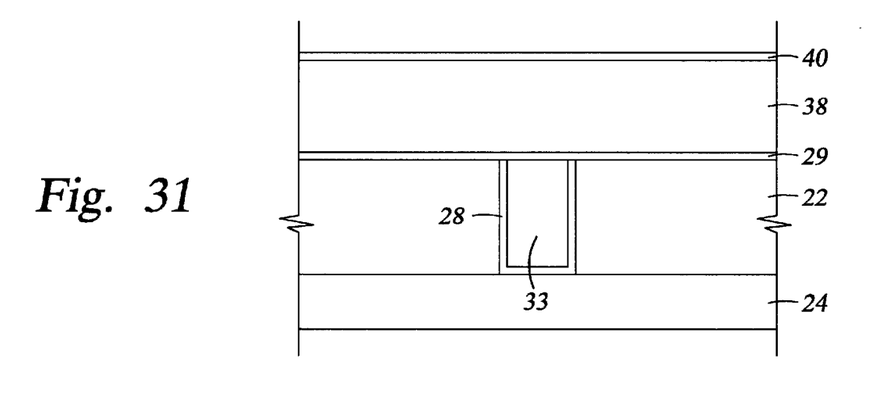
Figure 32:
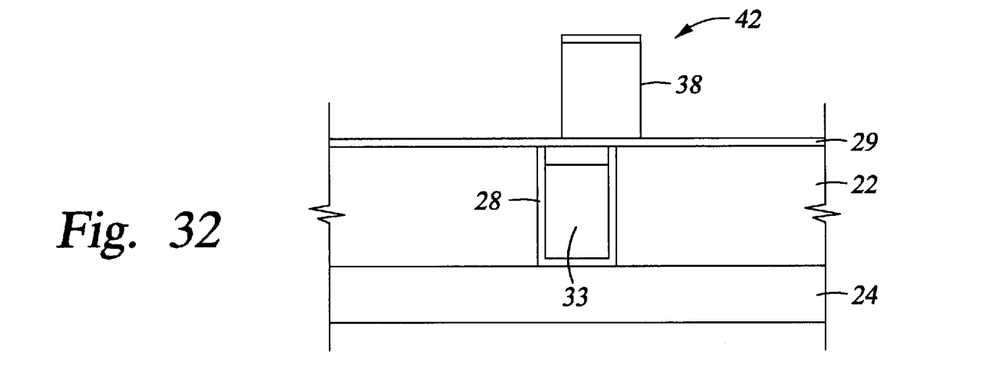

FIGS. 25 through 34 are cross sectional views of a substrate depicting another embodiment of a process sequence for forming an interconnect according to the invention. In this embodiment, similar layers will be similarly numbered for ease of description. FIGS. 25 through 28 depict similar steps disclosed in FIGS. 3 through 6 above including forming a via in a dielectric layer 22, forming a conformal barrier layer 28 in the via, filling the via 26 by depositing a metal therein. As stated above, the two-step low temperature process is a preferred technique, however, other known deposition techniques can be used. Next, the substrate is planarized using CMP. A barrier layer, such as a Ta/TaN layer 28 is then formed over the surface of the substrate including the field of the substrate and the upper surface of the via as shown in FIG. 29. Next, a metal stack comprised of metal layer 38 and ARC layer 40 is formed over the barrier layer 28 as shown in FIG. 31 and described above.

Figure 33:
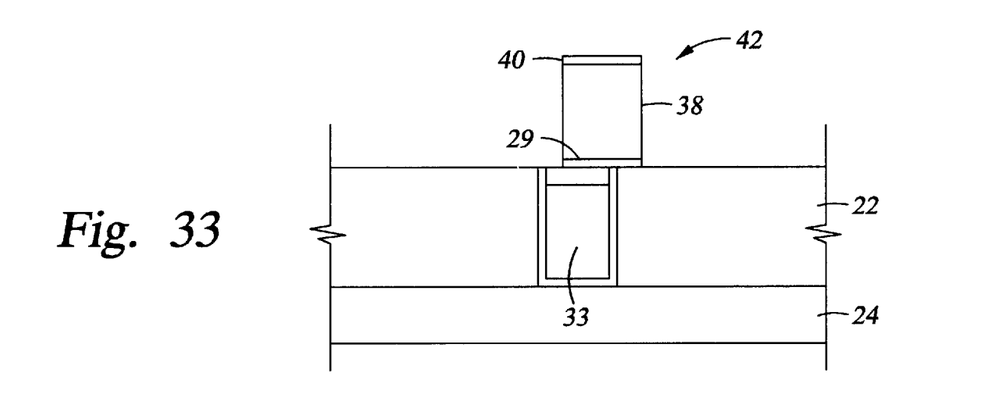
Figure 34:
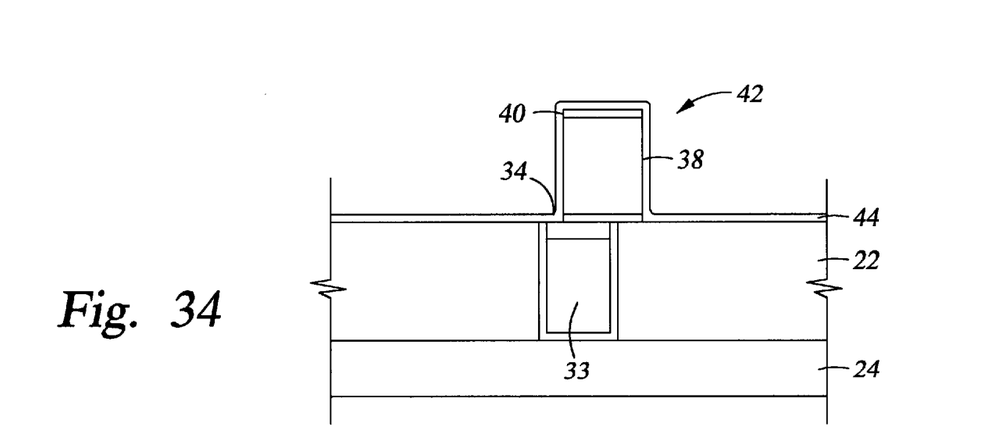
Figure 35:
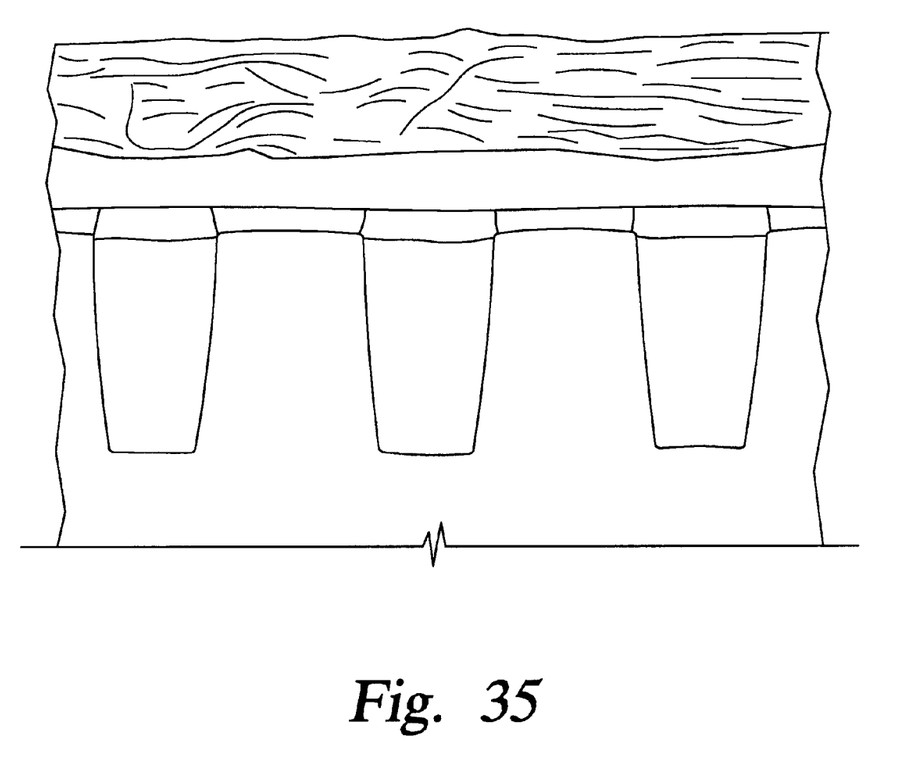
FIG. 35 is a SEM showing an interconnect formed according to one embodiment of the invention.

Next, the metal stack and barrier layer are etched in a single chamber or two chambers using at least two different chemistries. In the case of a copper interconnect, a chlorine based reactive ion etching process selective for copper over tantalum or tantalum nitride is used to etch the copper line as shown in FIG. 33. This chemistry is selective for copper and stops on the barrier layer 28 which is preferably made of tantalum or tantalum nitride. Once the end point of the copper etching process is detected or determined, a fluorine based chemistry is used to etch the barrier layer 28 down to the dielectric material 22 and the copper via 33. Examples of chlorine based gases include $SiCl_4$, $BCl_3$, HCl and $Cl_2$. Examples of fluorine based gases include $CHF_3$ and $CF_4$.

EXAMPLE 1

The following example was carried out using a photolithographer available from ASM, an integrated Endura processing system available from Applied Materials, Inc. located in Santa Clara, Calif. having an IMP PVD Ta/TaN chamber, a CVD Cu chamber, a PVD Cu chamber and a CVD W chamber mounted thereon, a Mirra CMP system available from Applied Materials, Inc. and a Centura DPS RIE metal etch system available from Applied Materials, Inc.

A substrate having a silicon oxide layer ($SiO_2$) formed over a conductive layer was used to form an interconnect according to one embodiment of the invention. A via having a width of 0.35 $\mu$m and a height of 1.2 $\mu$m was etched through the dielectric. The substrate was introduced into the Endura system and degassed at 350° C. for about forty (40) seconds.

The substrate was then transferred into a Pre-Clean II chamber available from Applied Materials, Inc. where about 250A were removed from the surface of the patterned dielectric.

Next, the cleaned substrate was transferred into the tantalum nitride high density plasma physical vapor deposition (HDP-PVD) chamber where a barrier layer comprising tantalum/tantalum nitride/tantalum was deposited conformally in the via and on the field of the substrate. An argon plasma was initially struck in the chamber and tantalum was initially deposited on the substrate. Nitrogen was then flown into the chamber and tantalum nitride was deposited onto the tantalum. Nitrogen delivery was then terminated and tantalum was then sputter deposited over the tantalum nitride.

The substrate was then transferred into a copper CVD chamber where a conformal wetting layer was deposited in the via using chemical vapor deposition (CVD) techniques. The pressure in the chamber was between about 1 and about 5 Torr and the substrate temperature was maintained at about 260° C. Cu(I) hfac tmvs was used as the copper source. The source liquid was flown at about 0.25 to about 2.0 ml/min with a carrier gas such as He, $H_2$ or Ar.

Next, the substrate was transferred into a copper PVD chamber where the via was completely filled using a low temperature (i.e., <450° C.) PVD technique.

The substrate was then moved into the chemical mechanical polishing system to planarize the copper layer back to the barrier layer and then the barrier layer back to the low k dielectric.

Alternatively, the substrate could be introduced into a DPS etch back chamber also available from Applied Materials, Inc. where the copper layer and barrier layer deposited on the field of the substrate can be removed.

Next, the substrate was moved into a WxZ CVD Chamber where a tungsten barrier layer was selectively deposited over the copper via and tantalum nitride barrier layer disposed in the via.

The substrate was then moved into a PVD Ta/TaN chamber where another barrier layer comprised of tantalum, tantalum nitride and tantalum was then deposited over the substrate to form a bottom barrier layer for the copper line subsequently formed thereover.

Next, the substrate was moved into a Cu PVD chamber where a copper blanket layer of about 1.2 μm was then deposited over the barrier layer using PVD techniques. The process was carried out at a target bias power of about 2 to about 10 kW and at a pressure of about 0.1 to about 15 mTorr.

The substrate was then moved into a Ta/TaN PVD chamber where an anti-reflective coating (ARC) was then deposited over the copper blanket layer to enhance resolution in the subsequent photolithography steps used to pattern the copper line.

The ARC was patterned using an oxide hard mask and both the ARC and copper blanket layer are etched to define a line over the plug formed below. Preferably, the W:Cu selectivity of the polishing process or the etch back process is greater than about 4:1. The copper line was etched using a chlorine based etch process.

EXAMPLE 2

The same equipment described in Example 1 was used to perform the process sequence of this example except that the tungsten CVD chamber is replaced with a tungsten PVD chamber, also available from Applied Materials, Inc.

A substrate having a silicon oxide layer ($SiO_2$) formed over a conductive layer was used to form an interconnect according to one embodiment of the invention. A via having a width of 0.35 μm and a height of 1.2 μm was etched through the dielectric. The substrate was introduced into the Endura® system and degassed at 350° C. for about forty (40) seconds.

The substrate was then transferred into a Pre-Clean II chamber available from Applied Materials, Inc. where about 250A were removed from the surface of the patterned dielectric to insure that any oxide formed at the bottom of the via/contact was removed.

Next, the cleaned substrate was transferred into a tantalum/tantalum nitride high density plasma physical vapor deposition (HDP-PVD) chamber where a barrier layer comprising tantalum/tantalum nitride/tantalum was deposited conformally in the via and on the field of the substrate.

The substrate was then transferred into a copper CVD chamber where a conformal wetting layer was deposited in the via using chemical vapor deposition (CVD) techniques as in Example 1.

Next, the substrate was transferred into a copper PVD chamber where the via was completely filled using a low temperature (i.e., <450° C.) PVD technique.

The substrate was then introduced into an etch back chamber also available from Applied Materials, Inc. where the copper layer on the field of the substrate was removed. The etching process was continued to over-etch the via and form a recess in the upper surface of the via.

Next, the substrate was degassed and pre-cleaned in a Pre-Clean II Chamber available from Applied Materials, Inc.

Next, the substrate was moved into a tungsten PVD chamber where a tungsten barrier layer was deposited over the copper via and tantalum nitride barrier layer on the field of the substrate. The process was carried out using a tungsten target and an argon flow rate of about 1 to about 50 sccm and a target bias of about 500W to about 16 kW.

Next, the substrate was moved into a CMP system where the W was removed from the field of the substrate to form a thin tungsten plug in the recess formed in the via.

Next, the substrate was moved into a TaN PVD chamber where a TaN layer was then deposited over the tungsten plug and field using PVD techniques as in Example 1.

Next, the substrate was moved into a Cu PVD chamber where a copper blanket layer was then deposited over the TaN layer using PVD techniques as in Example 1.

The substrate was then moved into a Ta/TaN PVD chamber or a WN CVD chamber where an anti-reflective coating (ARC) was then deposited over the copper blanket layer to enhance resolution in the subsequent photolithography steps used to pattern the copper line.

Figure 30:
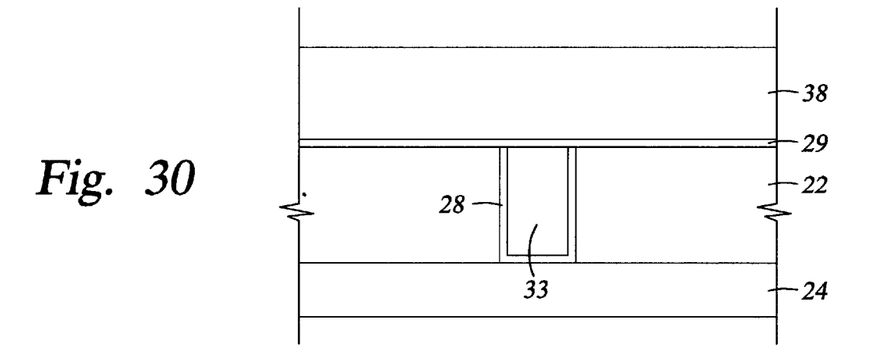

The ARC was patterned and both the ARC and copper blanket layer are etched to define a line over the plug formed below. The resulting structure is shown in FIG. 30.

EXAMPLE 3

The same equipment described in Example 1 was used to perform the process sequence of this example except that the tungsten CVD chamber is replaced with a tungsten PVD chamber, also available from Applied Materials, Inc.

A substrate having a silicon oxide layer ($SiO_2$) formed over a conductive layer was used to form an interconnect according to one embodiment of the invention. A via having a width of 0.35 μm and a height of 1.2 μm was etched through the dielectric. The substrate was introduced into the Endura system and degassed at 350° C. for about forty (40) seconds.

The substrate was then transferred into a Pre-Clean II chamber available from Applied Materials, Inc. where about 250A were removed from the surface of the patterned dielectric.

Next, the cleaned substrate was transferred into a tantalum/tantalum nitride high density plasma physical vapor deposition (HDP-PVD) chamber (known as an IMP chamber) where a barrier layer comprising tantalum/tantalum nitride/tantalum was deposited conformally in the via and on the field of the substrate as described above.

The substrate was then transferred into a copper CVD chamber where a conformal wetting layer was deposited in the via using chemical vapor deposition (CVD) techniques as described above.

Next, the substrate was transferred into a copper PVD chamber where the via was completely filled using a low temperature (i.e., <450° C.) PVD technique.

The substrate was then introduced into the Mirra CMP system also available from Applied Materials, Inc. where the copper layer on the field of the substrate was removed.

Next, the substrate was degassed and pre-cleaned in a Pre-Clean II Chamber available from Applied Materials, Inc.

Next, the substrate was moved into a tantalum/tantalum nitride PVD chamber where a tantalum/tantalum nitride barrier layer was deposited over substrate and the copper via.

Next, the substrate was moved into a Cu PVD chamber where a copper blanket layer was then deposited over the TaN layer using PVD techniques.

The substrate was then moved into a Ta/TaN PVD chamber or a WN CVD chamber where an anti-reflective coating (ARC) was then deposited over the copper blanket layer to enhance resolution in the subsequent photolithography steps used to pattern the copper line.

The ARC was patterned and both the ARC and copper blanket layer were etched using a chlorine based chemistry comprising $SiCl_4$, HCl and $BCl_3$ at a combined flow rate of between about 50–250 sccm to yield copper lines over the field. The pressure was maintained at about 5 mTorr to about 50 mTorr and the substrate was maintained at a temperature of about 150–350° C. A bias power in the range of 100–900W and a source power of about 800–1800W was delivered to the chamber. Next, the tantalum/tantalum nitride barrier layer on the field was removed using a fluorine based chemistry comprising $CHF_3$ or $CF_4$ and the same process parameters as used in the chlorine based etch process.

While foregoing is directed to the preferred embodiment of the present invention, other and further embodiments of the invention may be devised without departing from the basis scope thereof, and the scope thereof is determined by the claims that follow.

What is claimed is:

1. A method of forming an interconnect on a substrate, comprising:
    a) depositing a metal over a field of the substrate and in a via formed on the substrate;
    b) removing the metal from the field of the substrate using an etch process;
    c) selectively depositing a conductive barrier over the via;
    d) depositing a blanket metal layer over the conductive barrier and the field of the substrate; and
    e) etching a line in the blanket metal layer.

2. The method of claim 1 wherein the via and the line are comprised of copper.

3. The method of claim 1 wherein the conductive barrier is tungsten.

4. The method of claim 1 wherein the metal is removed from the field of the substrate by chemical mechanical polishing.

5. The method of claim 1 wherein the conductive barrier is comprised of tantalum and the blanket metal layer is comprised of copper.

6. A method of forming an interconnect on a substrate, comprising:
    a) depositing a metal over a field of the substrate and in a via formed on the substrate;
    b) removing the metal from the field of the substrate using an etch process;
    c) depositing a conductive barrier over the via;
    d) depositing a blanket metal layer over the conductive barrier and the field of the substrate; and
    e) etching a line in the blanket metal layer wherein the line is formed using an etch process which is tuned to selectively etch two different materials in the line.

7. The method of claim 6 wherein the conductive barrier is comprised of tantalum and the blanket metal layer is comprised of copper.

8. The method of claim 6 wherein etching a line comprises first etching the blanket metal layer using a chlorine based chemistry and then etching the conductive barrier using a fluorine based chemistry.

9. A method of forming an interconnect on a substrate, comprising:
    a) depositing a metal over a field of the substrate and in a via formed on the substrate;
    b) removing the metal from the field of the substrate using an etch process;
    c) depositing a conductive barrier comprised of tantalum over the via;
    d) depositing a blanket metal layer comprised of copper over the conductive barrier and the field of the substrate; and
    e) etching a line in the blanket metal layer wherein the line is formed using an etch process which is tuned to selectively etch two different materials in the line.

10. A method of forming an interconnect on a substrate, comprising:
    a) depositing a metal over a field of the substrate and in a via formed on the substrate;
    b) removing the metal from the field of the substrate using an etch process;
    c) depositing a conductive barrier over the via;
    d) depositing a blanket metal layer over the conductive barrier and the field of the substrate;
        1) etching the blanket metal layer using a chlorine based chemistry; and then etching the conductive barrier using a fluorine based chemistry.

* * * * *

UNITED STATES PATENT AND TRADEMARK OFFICE
CERTIFICATE OF CORRECTION

PATENT NO.    : 6,372,633 B1
DATED         : April 16, 2002
INVENTOR(S)   : Dan Maydan et al.

It is certified that error appears in the above-identified patent and that said Letters Patent is hereby corrected as shown below:

Title page,
Item [56], FOREIGN PATENT DOCUMENTS, please add:

-- EP 0 848 420 A2  6/1998  Ho1L/21/768
   EP 0 848 420 A3  6/1998  Ho1L/21/768 --

Column 9,
Line 25, please change "basis scope" to -- basic scope --.

Signed and Sealed this

Eleventh Day of March, 2003

JAMES E. ROGAN
*Director of the United States Patent and Trademark Office*